United States Patent
Deppe (10) Patent No.: US 9,031,109 B2
(45) Date of Patent: May 12, 2015

(54) LIGHT SOURCE, USE OF A DRIVER AND METHOD FOR DRIVING

(71) Applicant: KONINKLIJKE PHILIPS N.V., Eindhoven (NL)

(72) Inventor: Carsten Deppe, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/380,943

(22) PCT Filed: Feb. 20, 2013

(86) PCT No.: PCT/IB2013/051376
§ 371 (c)(1),
(2) Date: Aug. 26, 2014

(87) PCT Pub. No.: WO2013/128342
PCT Pub. Date: Sep. 6, 2013

(65) Prior Publication Data
US 2015/0036708 A1   Feb. 5, 2015

Related U.S. Application Data

(60) Provisional application No. 61/605,817, filed on Mar. 2, 2012.

(51) Int. Cl.
*H01S 3/00* (2006.01)
*H01S 5/062* (2006.01)

(52) U.S. Cl.
CPC ..................... *H01S 5/062* (2013.01)

(58) Field of Classification Search
USPC ................ 372/38.02, 38.07, 38.04, 38.01, 41
See application file for complete search history.

(56) References Cited

U.S. PATENT DOCUMENTS

| | | | |
|---|---|---|---|
| 6,154,473 A | | 11/2000 | Watanabe |
| 7,468,998 B2 * | | 12/2008 | Luo et al. .................... 372/38.02 |
| 7,606,273 B2 * | | 10/2009 | Zhu et al. ............................ 372/6 |
| 2006/0092999 A1 * | | 5/2006 | Machida et al. ........... 372/38.02 |
| 2008/0278941 A1 * | | 11/2008 | Logan et al. ................... 362/234 |
| 2010/0026208 A1 | | 2/2010 | Shteynberg |
| 2011/0006691 A1 * | | 1/2011 | Blaha et al. ................ 315/185 R |
| 2011/0012530 A1 * | | 1/2011 | Zheng et al. .................... 315/294 |
| 2011/0261846 A1 | | 10/2011 | Takaki |
| 2012/0286663 A1 * | | 11/2012 | Puvanakijjakorn et al. .... 315/85 |

FOREIGN PATENT DOCUMENTS

WO  2008137618 A1  11/2008
WO  2011008635 A1   1/2011

* cited by examiner

*Primary Examiner* — Kinam Park (57) ABSTRACT

The invention relates to solid state light source, a use of a driver circuit for driving a light emitting element (150) of a solid state light source, a method for driving a light emitting element (150) of a solid state light source and a corresponding computer program. The invention provides that for a large amount of an AC period the light emitting element (150) is directly supplied with the AC input directly forwarded by the driver circuit, wherein nevertheless it is prevented that power exceeding a desired level reaches the light emitting element (150). The invention is aimed at a realization with simplified components and/or reduced costs in comparison to known techniques.

13 Claims, 9 Drawing Sheets

LIGHT SOURCE, USE OF A DRIVER AND METHOD FOR DRIVING

CROSS-REFERENCE TO PRIOR APPLICATIONS

This application is the U.S. National Phase application under 35 U.S.C. §371 of International Application No. PCT/IB2013/051376, filed on Feb. 20, 2013, which claims the benefit of U.S. Provisional Patent Application No. 61/605,817, filed on Mar. 2, 2012. These applications are hereby incorporated by reference herein.

FIELD OF THE INVENTION

The invention relates to a solid state light source, a use of a driver circuit for driving a light emitting element of a solid state light source, a method for driving a light emitting element of a solid state light source and a corresponding computer program.

BACKGROUND OF THE INVENTION

A light emitting element like a laser diode or more particularly a VCSEL (vertical cavity surface emitting laser) is conventionally provided with a driver circuit which supplies power to the light emitting element, wherein it is aimed for the supplied power being basically constant and at least in the vicinity of a power value allowing for maximum efficiency. Such conventional driver circuit may for example include a power factor correcting first converter stage (PFC) connected to one or more capacitors, which store energy so that a second stage can deliver a basically constant power to the light emitting element. Such design is costly due to the constraints on characteristics, performance and accuracy of the used components.

SUMMARY OF THE INVENTION

It is an object of the present invention to provide a solid state light source, a use of a driver circuit for driving a light emitting element of a solid state light source, a method for driving a light emitting element of a solid state light source and a corresponding computer program which may be realized with simplified components and/or reduced costs.

In a first aspect of the present invention a solid state light source is presented having a driver circuit and a light emitting element, wherein the driver circuit is arranged for receiving an AC input and for supplying power to the light emitting element, wherein the light emitting element has a maximum efficiency power and a maximum operation power, wherein the driver circuit is arranged for forwarding power from the AC input to the light emitting element while limiting the forwarded power to an upper cut-off value between the maximum efficiency power and maximum operation power, inclusive.

Power is forwarded from the AC input to the light emitting element, resulting in a fluctuation of the light output of the light emitting element corresponding to the fluctuation in the power supplied by the AC input, while the light emitting element is protected against an excess of supply by limiting the provided power to a value up to the maximum operation power of the light emitting element. This allows for a simple operation and driving of the light emitting element, while it is realized that in a wide range of applications, in particular in those with constricting cost issues, a fluctuation or modulation of the light output is no significant disadvantage.

For example, there are considerations of using VCSEL diodes (or arrays thereof) as a laser source for generating infrared (IR) radiation. This may be used to apply heat for thermal treatment in industrial or domestic appliances. In many cases such heating is not sensitive to power fluctuations in the mains frequency range. A simplification and cost reduction for producing such VCSEL diodes for generating infrared radiation as an example of emitting light enables meeting hard cost targets in competition with conventional heat sources (e.g. conventional resistive heating elements).

Even though such applications are promising, it is to be noted that the light emitting element of the present invention is not limited to generating infrared radiation, as there are also further applications using other or overlapping ranges of radiation (or light) possible and conceivable.

The maximum operation power of the light emitting element in the present context is mostly determined by an issue of overheating the light emitting structure, wherein it is to be noted that the maximum operation power referred to here may be above an allowable operation power for continuous operation, due to the reduced thermal load of the fluctuating power supply in comparison to a constant or substantially constant power supply.

According to conventional topologies, there is a first stage which converts input power to power stored in a buffer (e.g. a capacitor), wherein a second stage supplies power to the load from the buffer. Even though there is a certain amount of ripple on the buffer voltage (due to imperfections of implementation and principal limitations), the aim of such topologies is usually to provide an as constant power supply as possible.

In contrast to such conventional topologies, the present invention provides that for a large amount of the AC period (preferably most of the time) the light emitting element (or a provided second stage coupled to the light emitting element) is directly supplied with the AC input directly forwarded by the driver circuit, wherein nevertheless it is prevented that power exceeding a desired level reaches the light emitting element.

It is further possible that during peak a converter charges a small buffer, wherein converter and buffer may be simpler and less costly than those of the conventional techniques. The stored energy may then be used to feed the second stage (or directly the load, i.e. the light emitting element) during a low voltage phase of the AC input.

In a preferred embodiment, the light emitting element further has a minimum operation power, wherein the driver circuit is arranged for storing power from the AC input exceeding the upper cut-off value and for supplying stored power to the light emitting element in addition to the forwarded power from the AC input during a period in which the power from the AC input is equal to or below a lower cut-off value.

A supply of power below the minimum operation power of the light emitting element does not result in any light output. However, in the above embodiment, the driver circuit directs power from the AC input which is not forwarded to the light emitting element, due to the power from the AC input going beyond the upper cut-off value, to a temporary power storage, wherein this temporarily stored power is then provided to the light emitting element in case the power from the AC input does not have a value exceeding the lower cut-off value. Thus, provided that the lower cut-off value and the upper cut-off value are appropriately set (i.e. the amount of energy stored during the power exceeding the upper cut-off value approximates the amount of energy need for maintaining operation during the power being lower than the lower cut-off value or than the minimum operation power) the power supplied to the light emitting element fluctuates between the upper cut-off value and the lower cut-off value, ensuring an ongoing operation, i.e. light output, of the light emitting element.

In a preferred embodiment, the light emitting element further has a minimum operation power, wherein the driver circuit is arranged forwarding power from the AC input to the light emitting element only when the forwarded power is equal to or more than a lower cut-off value.

If the forwarding power does not or does not sufficiently exceed the minimum operation power needed for operating the light emitting element, there is no point in forwarding such insufficient power to the light emitting element.

In a modification of the above embodiments (defined in claims 2 or 3), the lower cut-off value is between the minimum operation power and the maximum efficiency power, inclusive.

The lower cut-off value is not limited to the minimum operation power but may also be above such minimum operation power, due to considerations related to a particular realization of the present invention.

In another modification of the above embodiments (defined in claims 2 or 3), the light emitting element includes a plurality of light emitting members which are arranged for being supplied with power by the driver circuit independently, wherein the minimum operation power of the light emitting element is the minimum operation power of one or a subset of the plurality of light emitting members, wherein the driver circuit is arranged for supplying power to just the one or the subset of the plurality of light emitting members during a period in which the power from the AC input is equal to or below a reduction value.

If the light emitting element comprises two or more separately supply-able light emitting members and the available power does not suffice for operating all of the light emitting elements (i.e. the power does not longer exceed the reduction value), this modifications provides for a limitation of the power supply to only a subset of the light emitting members, i.e. one or more of the light emitting members are excluded from the power supply. This allows for an extension of the portion of the period of the AC input in which the power of the AC input may directly be used for supplying the light emitting element. If additionally the power exceeding the upper cut-off value is stored and later supplied to the light emitting element in addition to the forwarded power from the AC input, the components needed for storing and supplying the stored power may be designed to reduced specifications and for reduced costs. This may further be combined with an increase in the upper cut-off value in comparison to case where the complete light emitting element is always used, as less energy is needed for providing the supplementing power supply.

In a further modification of an above embodiment (defined in claim 3), the driver circuit is arranged for supplying the power from the AC input to a load other than the light emitting element when the power from the AC input is not equal to or more than the lower cut-off value.

The power level below the lower cut-off value is considered as insufficient for the operation of the light emitting element. Nevertheless, as the power is provided by the AC input, this power may be used for driving or operating another load or energy consuming element.

The interrupting of the power supply to the light emitting element in case the power from the AC input is at or below the lower cut-off value and in particular the supply of the provided power from the AC input to another load in such case may be used for further simplifying the general circuit design of the solid state light source in that a conventionally provided second stage for de-coupling may be omitted.

In another modification of an above embodiment (defined in claim 2), the driver circuit includes a capacitor for storing power from the AC input exceeding the upper cut-off value.

Power—or more specifically voltage—provided by the AC input is used for charging the capacitor, wherein the stored energy is then easily released at the appropriate timing from the charged capacitor.

In a preferred embodiment, the driver circuit is arranged for supplying a portion of the power from the AC input to a load other than the light emitting element during a period in which the power from the AC input exceeds the upper cut-off value.

In the period of time in which the power form the AC input goes beyond the upper cut-off value, i.e. in the period in which the AC input provides more power than that forwarded to the light emitting element, this additionally provided power may be used for driving or operating another energy-consuming element, rather than simply rejecting the additionally power.

In a preferred embodiment, the light emitting element includes a plurality of light emitting members which are arranged for being supplied with power by the driver circuit independently, wherein the maximum operation power of the light emitting element is the maximum operation power of the plurality of light emitting members, wherein the driver circuit is arranged for supplying power to just a subset of the plurality of light emitting members during a period in which the power from the AC input is equal to or below an addition value.

If the light emitting element comprises two or more separately supply-able light emitting members and the available power is below the addition value, this modification provides for a limitation of the power supply to only a subset of the light emitting members, i.e. one or more of the light emitting members are excluded from the power supply. However, if the available power exceeds the addition value, this additionally available power is then used for additionally driving the remaining light emitting members also. This means that only during a peak portion of the power supply the complete light emitting element is operated while otherwise one or more of the light emitting members of the light emitting element are not driven. Thus allows for an additional use of peak power, other than supplying the peak power to another load (see above).

In a preferred embodiment, the driver circuit includes a single-ended primary-inductor converter, a boost converter or a synchronous inverter, arranged such that it is controllable whether an output of the converter or inverter and/or the power from the AC input is forwarded to the light emitting element. In particular, the mentioned elements may be provided in parallel to a diode.

It was found that such circuit elements may advantageously used in the context of the present invention.

In a preferred embodiment, the light emitting element includes a laser emitting element, preferably a laser diode, wherein most preferably the light emitting element includes a VCSEL.

In particular for the VCSEL, there are several applications like the use for heating by means of infrared radiation which may benefit from the present invention.

In a preferred embodiment, the lower cut-off value and the upper cut-off value are set in such a way that the efficiency of the light emitting element at the lower cut-off value corresponds to the efficiency of the light emitting element at the upper cut-off value.

Thus, at least an efficiency of the use of power is provided which is determined by the lower cut-off value and the upper cut-off value correspondingly.

In a preferred embodiment, the upper cut-off value is between 1.0 to 3.0 times the value of the maximum efficiency power, inclusive.

The selection of an appropriate upper cut-off value largely depends on the characteristics of the light emitting element used in the particular implementation, wherein nevertheless the above range is expected to yield good results.

In a preferred embodiment, the lower cut-off value is between 0.2 to 1.0 times the value of the maximum efficiency power, inclusive.

The selection of an appropriate lower cut-off value largely depends on the characteristics of the light emitting element used in the particular implementation, wherein nevertheless the above range is expected to yield good results.

In a preferred modification, the lower cut-off value and the upper cut-off value are in set in corresponding sub-ranges of the above mentioned range. For example, if the lower cut-off value is set to be closer to the lower end of the respective range, e.g. set to 0.3 times the value of the maximum efficiency power, the upper cut-off value is correspondingly set also closer to the lower end its respective range, e.g. set to maximum efficiency power (or 1.1 times the maximum efficiency power). Alternatively, the lower cut-off value may be set, for example, to 0.8 time the maximum efficiency power while the upper cut-off value is then set, for example, to 3.0 times the maximum efficiency power.

It is to be noted that in addition or as an alternative to considerations of power efficiency, considerations on maximum allowable current and/or voltage may also be used for setting the upper cut-off value, in particular in view of the service life of the light emitting element and/or the driver circuit.

It is further to be noted that the present invention is not limited to having an AC input exactly following a sinus curve. In practical implementations, the power mains providing the AC input is not following a sinus curve but includes also further (higher) harmonics.

If the waveform followed by the AC input is at least approximately known, the control of the driver circuit operation (and thus indirectly the light emitting element) may be based on the timing, i.e. control is based on the time-position in the period of the AC input. In such case, the timing for stopping the forwarding of power from the AC input etc. is only indirectly related to the currently provided power from the AC input, which in turn is related to the time-position in the period of the AC input.

Alternatively or additionally, the control may also be based on an actual determination of the currently provided power from the AC input, wherein the control is then based on such measuring.

A possible combination is the determination of the waveform of the AC input over a number of periods, wherein thereafter the information on the waveform is then used for controlling the driver circuit operation based on the timing.

Furthermore, it is also not necessary that the solid state light source behaves towards the AC input like a resistive load. In other words, it is not necessary that the current exactly follows the supplied voltage.

For example, the power behavior for a 2.3 kW device connected in accordance to IEC/EN 61000-3-2 Class A may be made such that the current rises faster—in view of the allowed harmonics—than the first order sinus curve, further reaching only a smaller maximum value. Thus, the current remains in comparison at a high level for a longer time and drops faster during the second quarter of the period. Accordingly, in comparison to the power of an input following a sinus curve, the actually used power has a smaller peak, wherein the "valley" between the peaks is narrower. This means than the time period during which the actually used power is below the lower cut-off value is shorter in comparison a case following the sinus curve.

Taking into account the above possibilities in the behavior of the solid state light source towards the AC input allows for an additional reduction in the constraints on components used in the driver circuit.

In a further aspect of the present invention a use of a driver circuit for driving a light emitting element of a solid state light source is presented, wherein the driver circuit is arranged for receiving an AC input and for supplying power to the light emitting element, wherein the light emitting element has a maximum efficiency power and a maximum operation power, wherein the driver circuit is arranged for forwarding power from the AC input to the light emitting element while limiting the forwarded power to an upper cut-off value between the maximum efficiency power and maximum operation power, inclusive.

In a further aspect of the present a method for driving a light emitting element of a solid state light source is presented, the light emitting element having a maximum efficiency power and a maximum operation power, the method including: receiving an AC input and supplying power to the light emitting element, and forwarding power from the AC input to the light emitting element while limiting the forwarded power to an upper cut-off value between the maximum efficiency power and maximum operation power, inclusive.

In a further aspect of the present invention a computer program for driving a light emitting element of a solid state light source is presented, the computer program comprising program code means for causing the above method to be carried out when the computer program is run on a computer controlling the solid state light source.

It shall be understood that the solid state light source of claim 1, the use of a driver circuit of claim 12, the method for driving a light emitting element of claim 14, and the computer program of claim 15 have similar and/or identical preferred embodiments, in particular, as defined in the dependent claims.

It shall be understood that a preferred embodiment of the invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
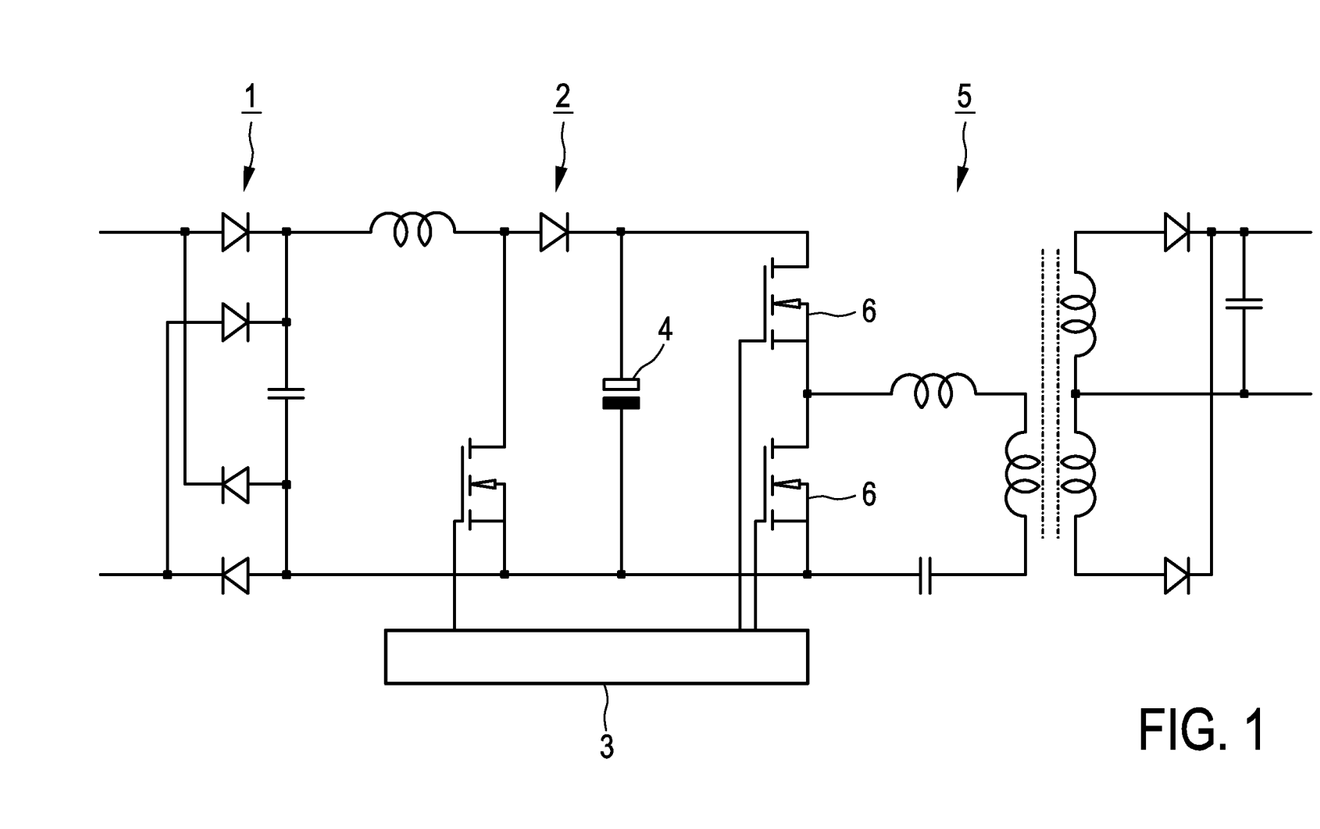
FIG. 1 shows an example of a conventional driver circuit.

FIG. 1 shows an example of a conventional driver circuit. The driver circuit includes on the input side (left) a diode bridge 1 including four diodes, wherein connected thereto is a boost converter 2 which is controlled by control unit 3 to charge a capacitor 4 thereof to a suitable voltage. There is further provided a second stage 5, which includes switches 6, which are also controlled by the control unit 3, wherein the output to provided to the right. The skilled person is well familiar with the principle design and operation of such conventional driver circuit and thereof a further discussion thereof may be omitted here.

In the following discussion of the shown circuits, the input side is always provided on the left, while the output is supplied to the right. This way of illustration is not to be understood as a limitation.

Figure 2:
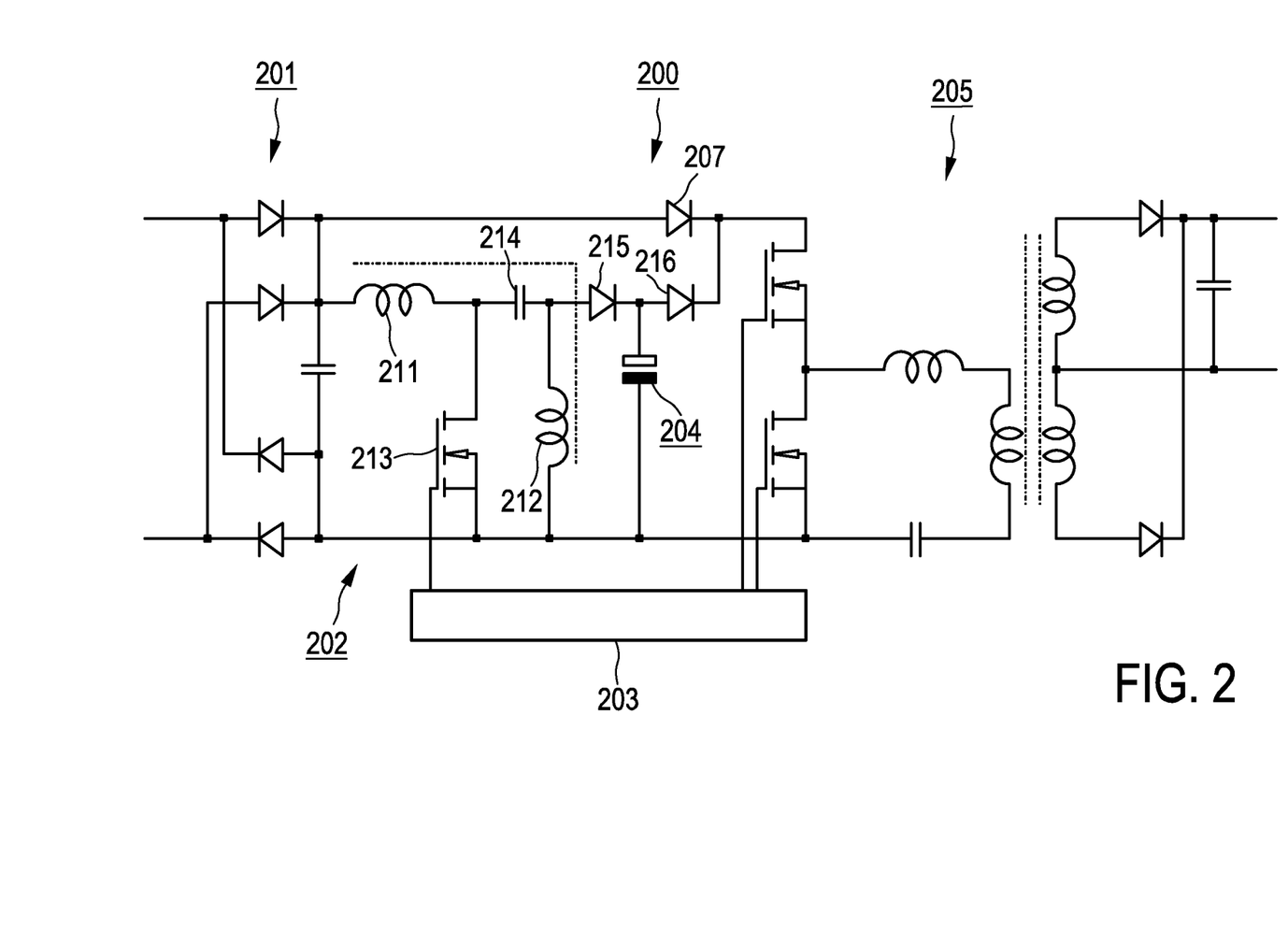
FIG. 2 shows a first exemplary embodiment of a driver circuit according to the present invention.

FIG. 2 shows a first embodiment of a driver circuit 200 according to the present invention. Similar to the driver circuit of FIG. 1, the driver circuit 200 includes a diode bridge 201. Connected to the diode bridge 201, the driver circuit 200 further includes a single-ended primary inductor converter (SEPIC) 202 with a diode 216 in series and a diode 207 provided in parallel to the SEPIC 202 and the diode 216. The SEPIC 202 is controlled by a control unit 203. Coupled to the output of the SEPIC 202 and the diode 207, there is a second stage of the driver circuit 200, mainly provided for de-coupling of the light emitting element (not shown), which corresponds to the second stage 5 of the conventional driver circuit shown in FIG. 1 The second stage is thus not further discussed here.

The SEPIC 202 includes two inductors 211, 212 having a common core, a switch 213, a capacitor 214 and a diode 215, which supply to a buffer capacitor 204, wherein the voltage level in the capacitor 204 is lower in comparison to that of capacitor 4 of FIG. 1.

Through the diode 207, power from the input is directly provided to the second stage 205 connected to the light emitting element (not shown) on the output side.

The control is performed by means of the diodes 207 and 216 as well as an appropriate setting of the voltage level at the buffer capacitor 204. The voltage level of the buffer capacitor is controlled to such a level that it is equal to the rectified AC input voltage at the time when the AC input power reaches the lower cut-off value (see time t4 in FIG. 9, discussed below).

Figure 9:
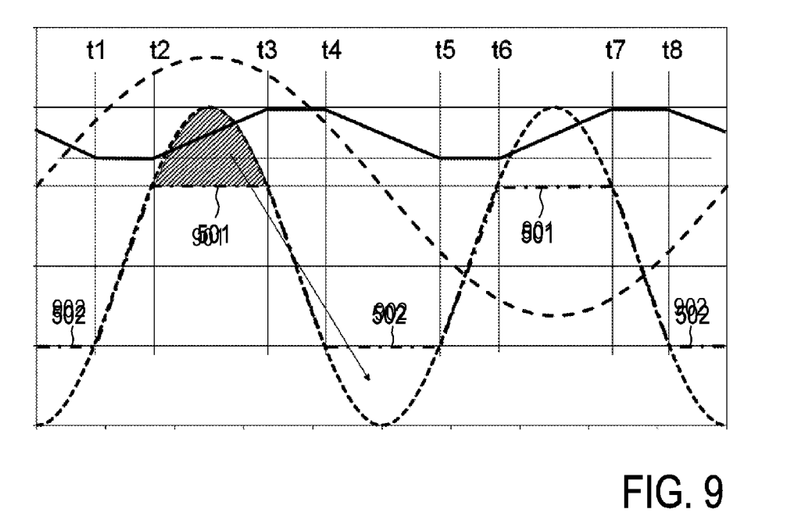
FIG. 9 illustrates en exemplary relation of AC input voltage, AC input power, forwarded power and buffer voltage.

FIG. 9 illustrates an exemplary relation of AC input voltage, AC input power, forwarded power and buffer voltage for the example of FIG. 2. Starting at t1, input power is directly feed through to the second stage 205 (and thus eventually supplied to the light emitting element as forwarded power). The AC input power is indicated by a shortly dashed line, wherein the power supplied to the light emitting element is indicated by a dashed and dotted line. The charge in the buffer capacitor 204 (indicated by the solid line) is constant. At t2 the AC input would allow higher power (i.e. exceeding the upper cut-off value 901) and second stage is controlled to keep the outputted power at the upper cut-off value 901. The AC input exceeding the upper cut-off value is used for charging the buffer capacitor 204. At t3 the first stage (i.e. the SEPIC 202) is stopped and again all power supplied by the AC input goes to the light emitting element. At t4 the AC input is below the lower cut-off value 902 (i.e. considered no longer sufficient for minimal useful output), and the diode 216 on the output side of the SEPIC 202 connects the buffer capacitor 204 to the second stage 205 to supply the previously stored energy, while the SEPIC 202 is controlled to pump available power into the buffer in order to maintain a desired input current shape. At t5, the AC input reaches the lower cut-off value 902 and via diode 207 the AC input is supplied to the second stage 205 (while diode 216 becomes non conductive again). The second half cycle of a period of the supplied AC voltage (indicated by the long dashed line) corresponds to the first and the control at times t5, t6, t7 and t8 corresponds to that at times t1, t2, t3 and t4 respectively. The energy illustrated by the hatched area (i.e. the excess power during the limitation of the forwarded power) is supplied to the light emitting element during the period in which the AC input power does not exceed the lower cut-off value 902 (illustrated by the arrow in FIG. 9).

It is to be noted that the level relations between the AC input voltage, the AC input power, the forwarded power and the buffer voltage at not to scale and are provided for illustrative purposes only.

Figure 3:
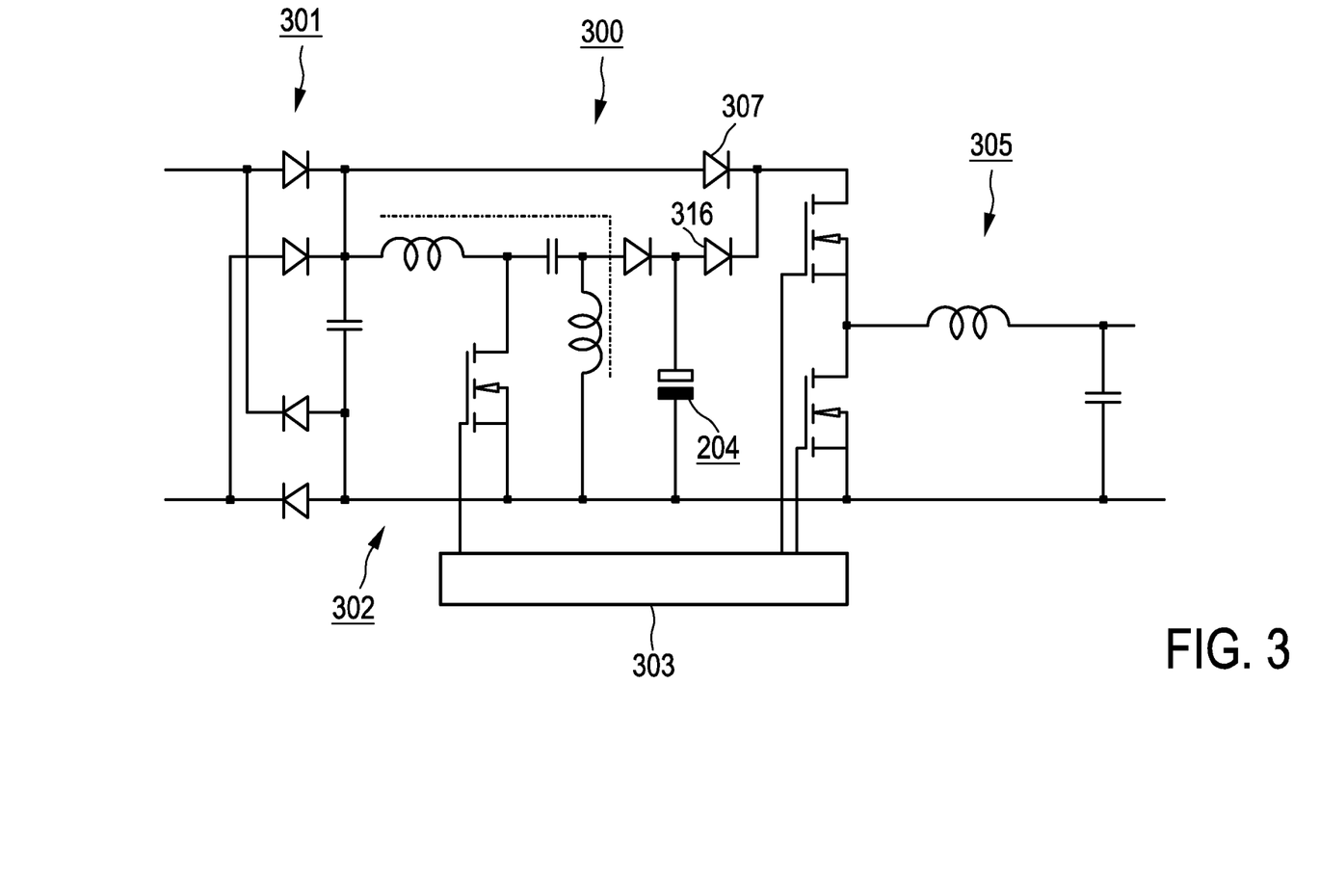
FIG. 3 shows a second exemplary embodiment of a driver circuit according to the present invention.

FIG. 3 shows a second exemplary embodiment of a driver circuit 300 according to the present invention. The driver circuit 300 includes a first stage (including diode bridge 301, SEPIC 302 and diodes 307, 316) and a second stage 305, wherein the first stage of driver circuit 300 corresponds to that of driver circuit 200 discussed above. If there is no need for a decoupling from the power mains, the second stage 305 may be provided in much simpler way, wherein otherwise the control corresponds to that of the driver circuit 200 discussed above.

Figure 4:
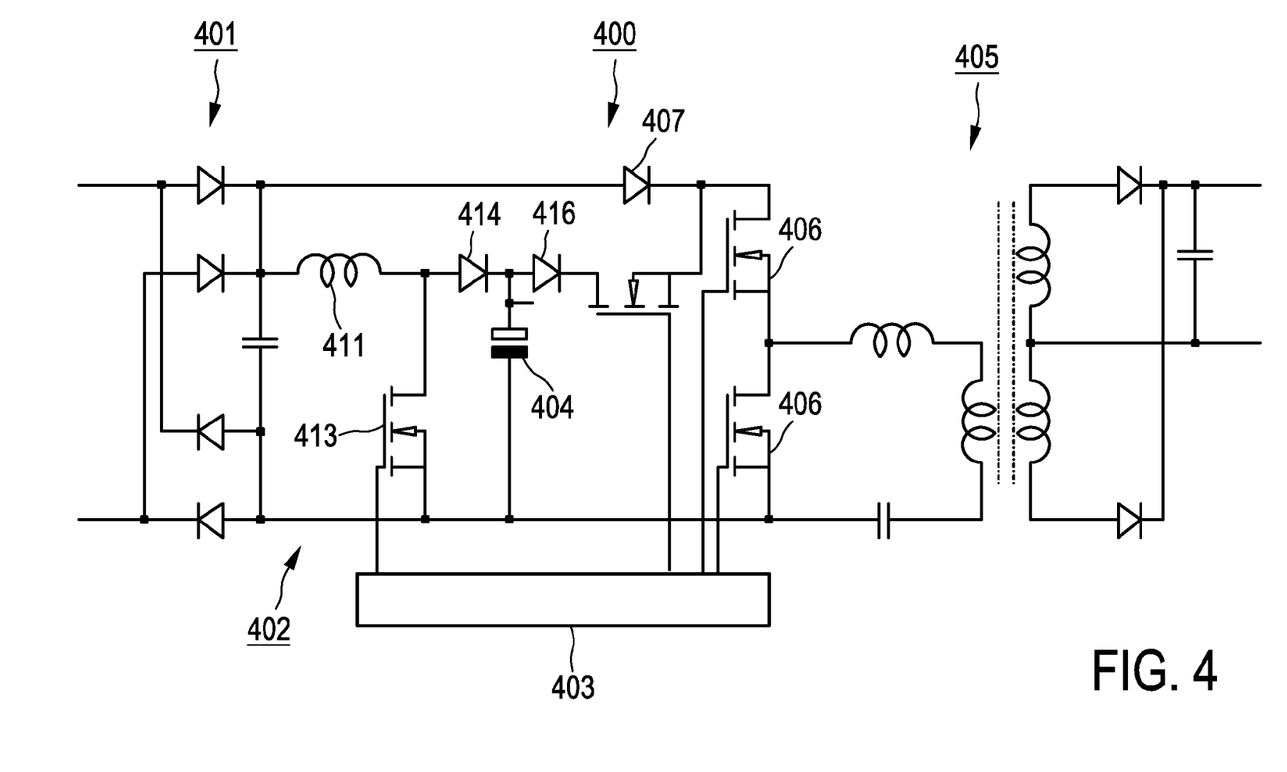
FIG. 4 shows a third exemplary embodiment of a driver circuit according to the present invention.

FIG. 4 shows a third exemplary embodiment of a driver circuit 400 according to the present invention. The driver circuit 400 is similar to that of FIG. 2 (again including a decoupling second stage 405), wherein the SEPIC of FIG. 2 is replaced by a boost converter 402. The driver circuit 400 includes a diode bridge 401, wherein, similar to the case of FIG. 2 diodes 407 and 416 are provided. The boost converter 402 includes an inductor 411, a diode 414 and a switch 413, while outputting to a buffer capacitor 404. In operation of the driver circuit 400, in order to avoid diode 414 become conductive; the voltage in the buffer capacitor 404 has to be higher than that of the AC input. In order to stop the voltage from buffer capacitor 404 from being supplied to the second stage 405, there is additionally provided a further switch 417.

Referring to the timing of FIG. 9, between t1 and t2, switches 413 and 417 are open, wherein switches 406 directly work on the rectified AC input. Between t2 and t3, switches 406 continue their operation, wherein the control unit 403 causes a limitation of the forwarded power. Switch 413 is controlled to store power (see hatched area in FIG. 9) in the buffer capacitor 404. Between t3 and t4, switches 413 and 417 are open, wherein switches 406 directly work on the rectified AC input, again. Between t4 and t5, switch 417 is closed, wherein switches 406 are controlled such that despite rather high voltage only small power is forwarded, wherein switch 413 is controlled to receive power from the AC input.

It is noted that diode 416 may be omitted.

Figure 5:
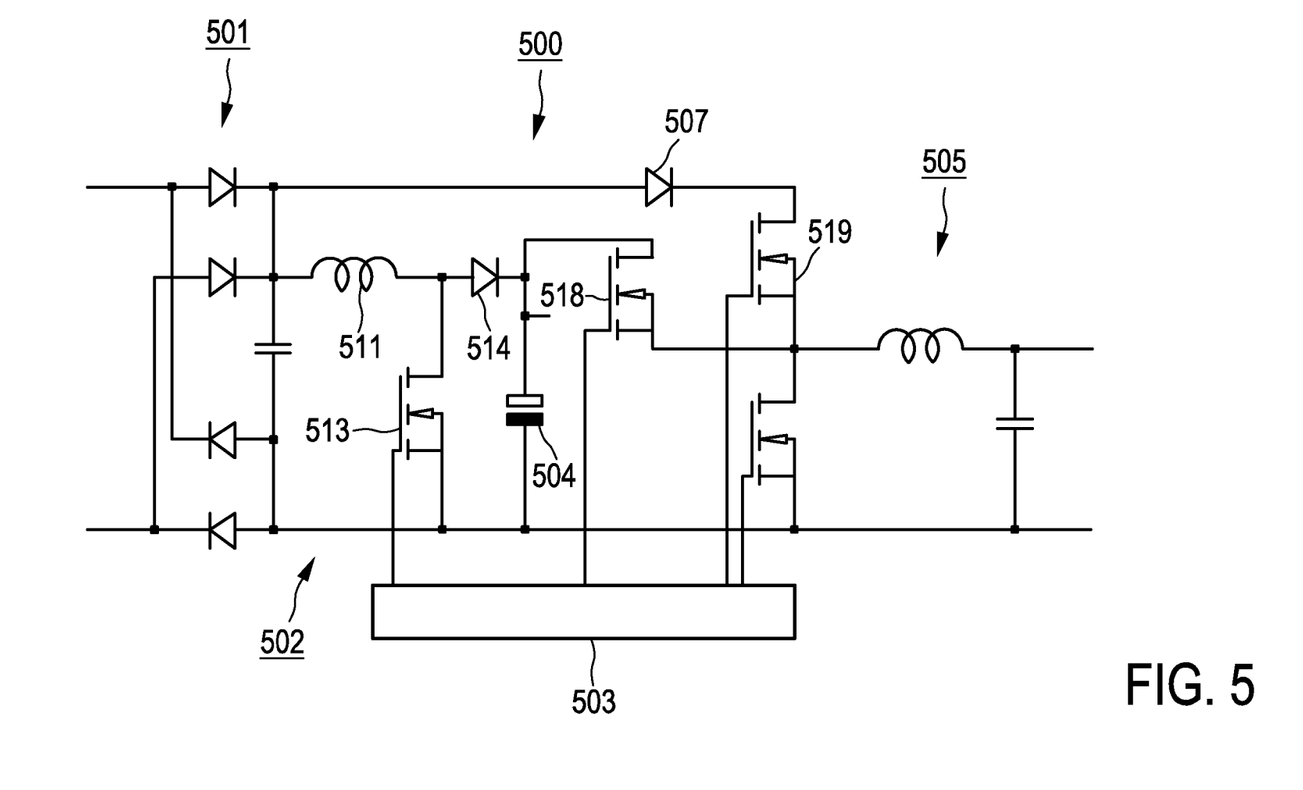
FIG. 5 shows a fourth exemplary embodiment of a driver circuit according to the present invention.

FIG. 5 shows a fourth exemplary embodiment of a driver circuit 500 according to the present invention. The driver circuit 500 includes concepts of the driver circuit 300 illustrated in FIG. 3 (a simplified second stage 505) and the driver circuit 400 of FIG. 4 (the use of a boost converter 502 including an inductor 511, a switch 513 and a diode 514, coupled to a buffer capacitor 504). Instead of the additional switch 417 provided in FIG. 4, in the driver circuit 500 there are provided two buck switches 518, 519. Referring to the timing of FIG. 9, between t1 and t4, the second stage (buck converter) 505 works with switch 519 switching while switch 518 is open. Between t4 and t5, switch 518 is switching while switch 519 is open. The switching of switches 518, 519 is provided in a controlled manner with high frequency, as it will be appreciated by the skilled person.

Figure 6:
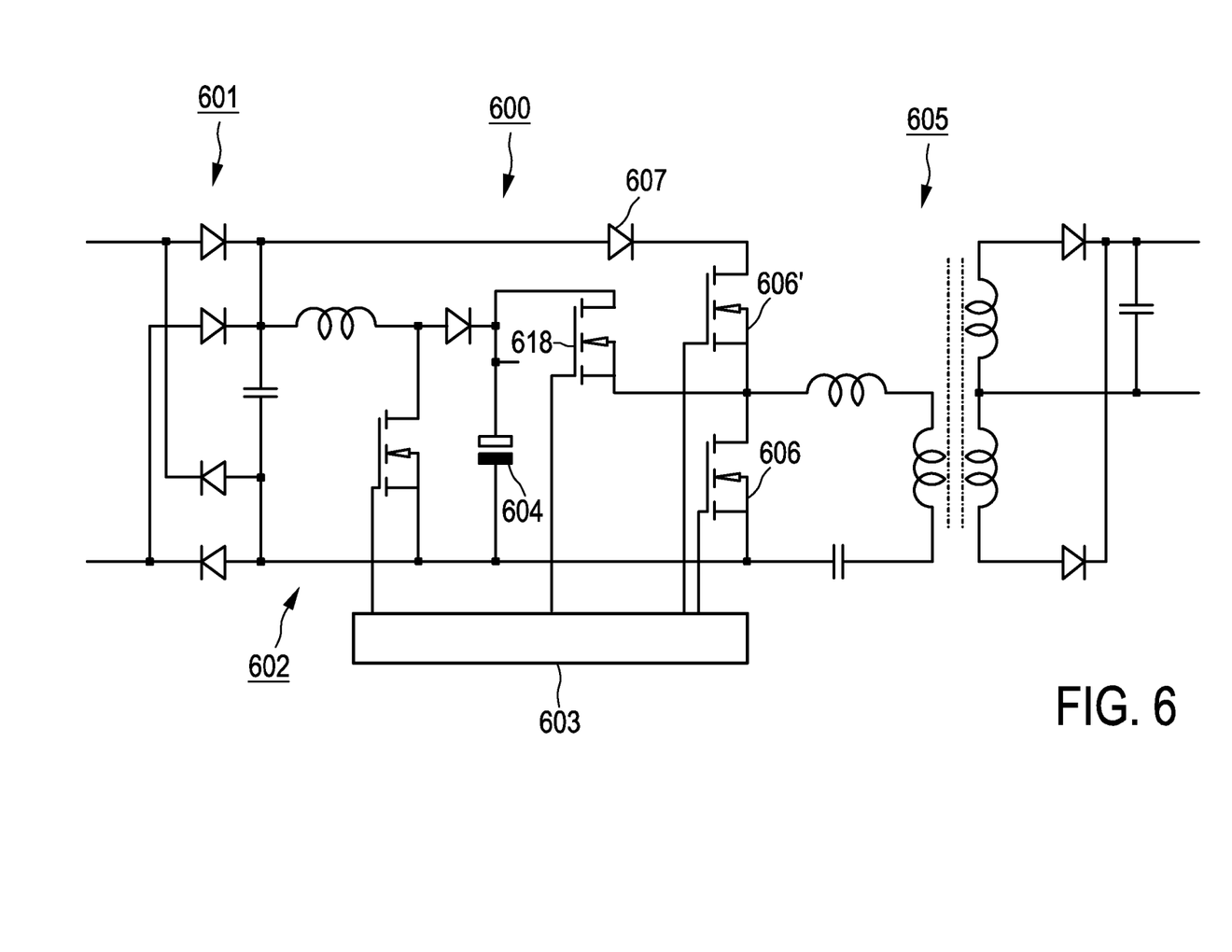
FIG. 6 shows a fifth exemplary embodiment of a driver circuit according to the present invention.

FIG. 6 shows a fifth exemplary embodiment of a driver circuit 600 according to the present invention. The driver circuit 600 follows a similar approach to that of the driver circuit of FIG. 5 (also including a diode bridge 601, a boost converter 602 supplying to a buffer capacitor 604 with a diode 607 provided in parallel to the boost converter 602), wherein the upper switch 606' of the half-bridge of the de-coupling second stage 605 is supplemented by a corresponding switch 618. Again referring to the timing of FIG. 9, between t1 and t4 the half bridge works with switches 606 and 606' switching, while switch 618 is open, wherein between t4 and t5, switches 606 and 618 are switching with switch 606' open.

Figure 7:
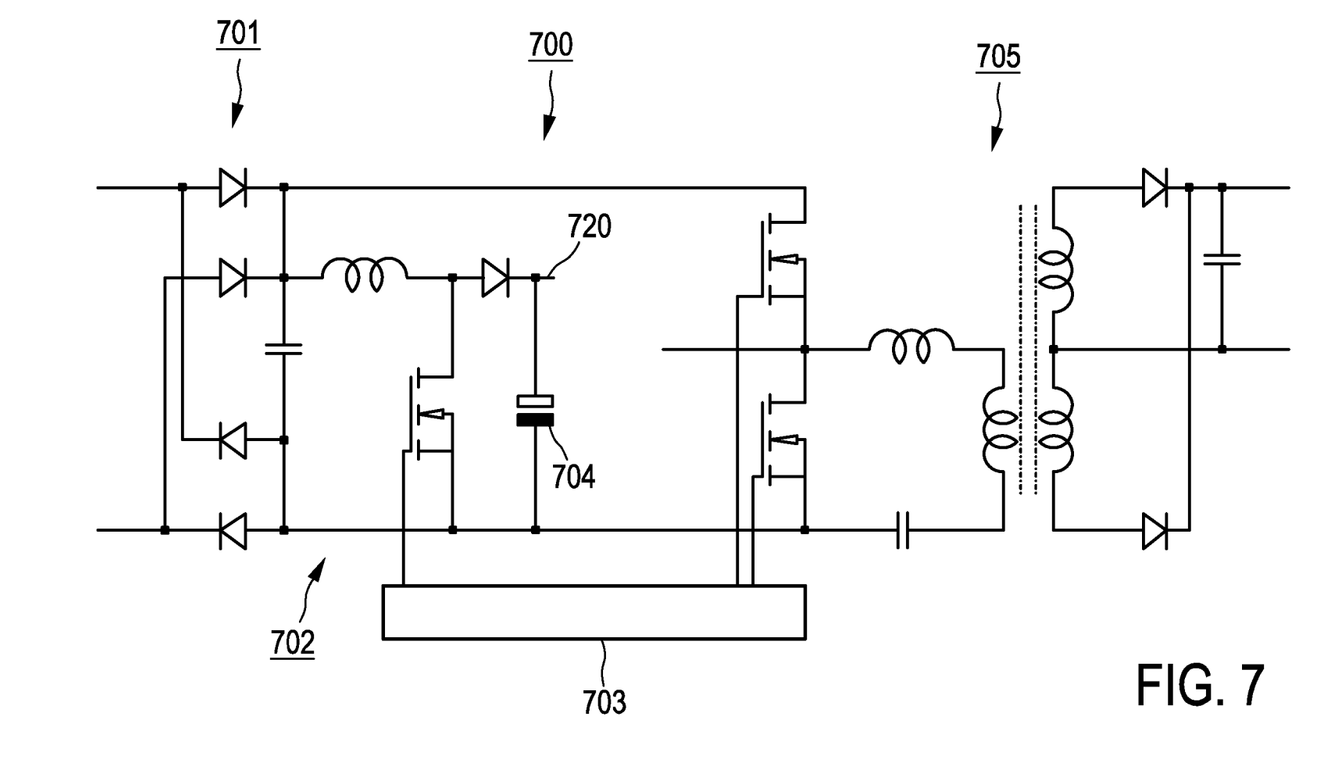
FIG. 7 shows a sixth exemplary embodiment of a driver circuit according to the present invention.

FIG. 7 shows a sixth exemplary embodiment of a driver circuit 700 according to the present invention. The driver circuit 700 includes, similar to previously discussed driver circuits a diode bridge 701 and a second stage 705, supplied by the diode bridge 701. Differing from the previously discussed exemplary embodiments, the driver circuit 700 includes a boost converter 702 which is not coupled to the output side to the light emitting element (i.e. via the second stage). The boost converter includes an additional output to a different load (not shown), which supplies the voltage (or energy) stored in the buffer capacitor 704 connected to the boost converter.

There are possible implementations where there are—in addition to the light emitting element—further loads, which may be supplied with the power from the AC input not forwarded to the light emitting element. Complying with requirements like IEC (e.g. harmonics) while not forwarding all received power to the light emitting elements becomes possible if the power not forwarded is supplied to other loads. In the case of driver circuit 700, the power exceeding the upper cut-off value is provided to the other load (not shown), wherein also during the AC input power not exceeding the lower cut-off value, the AC input power is supplied to the other load (not shown). During this time, the light emitting element is not provided with any power.

Figure 8:
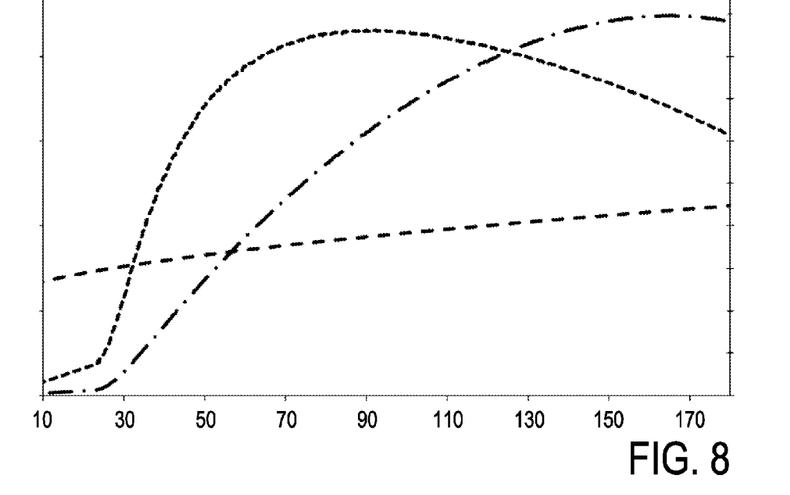
FIG. 8 illustrates an exemplary relation voltage supplied to a light emitting element, light output and efficiency.

FIG. 8 illustrates an exemplary relation voltage supplied to a light emitting element, light output and efficiency. The abscissa of the diagram of FIG. 8 refers to the power supplied to a VCSEL as an example of a light emitting element (in Watt). The voltage is indicated by the dashed line and provided just for completeness. The light output (power) of the light emitting element is indicated by the dashed and dotted line. The efficiency is indicated by the dotted line. It can be seen that the VCSEL has its best efficiency around 90 W input power, wherein it is realized by the inventor that, for example, also the range of 50 W to 150 W is acceptable for operating the VCSEL, while an operation below 45 W and above 160 W seems undesirable. It was found that in comparison to the conventional technique, for an operation of the VCSEL with a power fluctuating between 50 W and 150 W, the size of the first stage of the driver circuit may be reduced to ¼.

Figure 10:
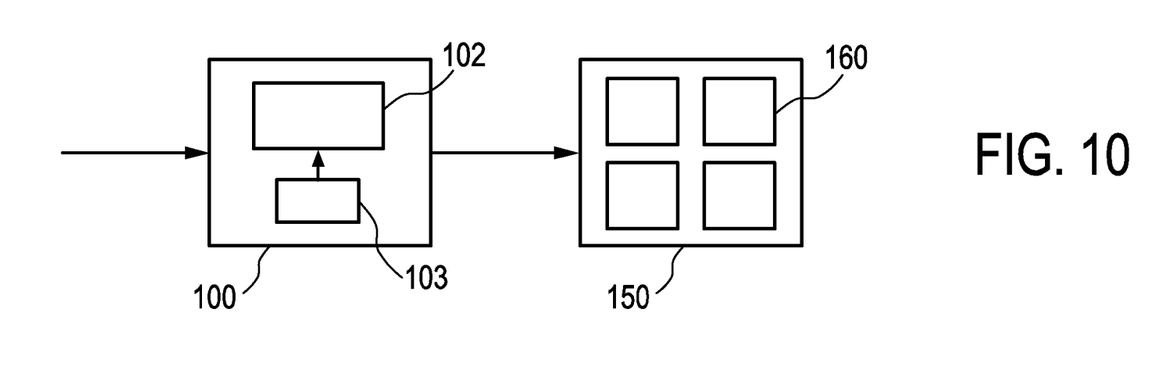
FIG. 10 shows a schematic illustration of an embodiment of a solid state light source according to the present invention.

FIG. 10 shows a schematic illustration of an embodiment of a solid state light source according to the present invention. The solid state light source as shown FIG. 10 includes a driver circuit 100 including a control unit 103 and further circuit elements 102, for example, as discussed with regard to FIGS. 2 to 7. The solid state light source further includes a light emitting element 150 including several light emitting members 160, which may be supplied separately with power. The driver circuit 100 receives power from an AC input and supplies power to the light emitting element 150 according to the present invention.

Figure 11:
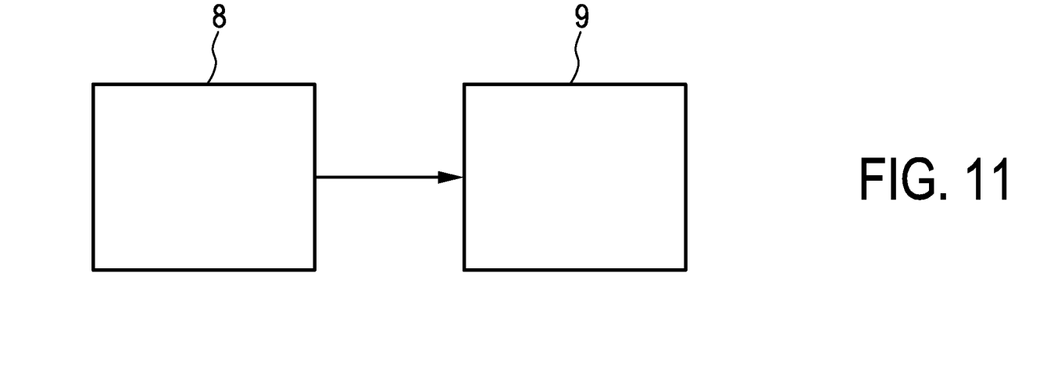
FIG. 11 shows a schematic flow diagram illustrating an embodiment of a method according to the present invention.

FIG. 11 shows a schematic flow diagram illustrating an embodiment of a method according to the present invention. The method includes the steps of receiving (Step 8) an AC input and supplying power to the light emitting element, and forwarding (Step 9) power from the AC input to the light emitting element while limiting the forwarded power to an upper cut-off value between the maximum efficiency power and maximum operation power, inclusive.

Other variations to the disclosed embodiments can be understood and effected by those skilled in the art in practicing the claimed invention, from a study of the drawings, the disclosure, and the appended claims.

It is to be noted that in the circuit illustrations discussed here diodes may be replaced by adequately controlled switches, even though practical implementations may be realized more easy using diodes.

It is to be noted that the actual value of maximum operation power, the maximum efficiency power and minimum operation power and also accordingly the upper and lower cut-off value and the reduction value and the addition value are not necessarily constant for a given implementation. Operation details and conditions like ambient temperature may also have an impact on the characteristics of the solid state light source, which might be reflected in adaptations of the values set according to the present invention over time.

In the embodiments illustrated and discussed above, there is provided a full-wave rectifier in the form of a bridge rectifier using four diodes (diode bridge). It is to be noted that a rectification may also be provided by means of other circuit elements, with which the skilled person is also familiar.

In the claims, the word "comprising" does not exclude other elements or steps, and the indefinite article "a" or "an" does not exclude a plurality.

An indication that a value is between a lower limit and an upper limit, inclusive, is to be understood and that the value may have any value inside the given range including the values of the lower limit and the upper limit.

A single unit or device may fulfill the functions of several items recited in the claims. The mere fact that certain measures are recited in mutually different dependent claims does not indicate that a combination of these measures cannot be used to advantage.

Operations like switching, calculating of power values, comparing of power values and controlling or selecting elements of the light emitting element and/or the driver circuit can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

The invention claimed is:

1. A solid state light source having a driver circuit and a light emitting element,
    wherein the driver circuit is arranged for receiving an AC input and for supplying power with an AC period to the light emitting element, wherein the light emitting element has a maximum efficiency power and a maximum operation power, wherein the driver circuit is arranged for forwarding power from the AC input to the light emitting element while limiting the forwarded power to an upper cut-off value between the maximum efficiency power and maximum operation power, inclusive, such that the solid state light source during light emission can be directly supplied with the AC input directly forwarded by the driver circuit during a part of the AC period, wherein the light emitting element further has a minimum operation power, and wherein the driver circuit is arranged for storing power from the AC input exceeding the upper cut-off value and for supplying stored power to the light emitting element in addition to the forwarded power from the AC input during a period in which the power from the AC input is equal to or below a lower cut-off value.

2. The light source of claim 1, wherein the light emitting element further has a minimum operation power, and wherein the driver circuit is arranged forwarding power from the AC input to the light emitting element only when the forwarded power is equal to or more than the lower cut-off value.

3. The light source of claim 2, wherein the lower cut-off value is between the minimum operation power and the maximum efficiency power, inclusive.

4. The light source of claim 2, wherein the light emitting element includes a plurality of light emitting members which are arranged for being supplied with power by the driver circuit independently, wherein the minimum operation power of the light emitting element is the minimum operation power of one or a subset of the plurality of light emitting members, wherein the driver circuit is arranged for supplying power to just the one or the subset of the plurality of light emitting members during a period in which the power from the AC input is equal to or below a reduction value.

5. The light source of claim 2, wherein the driver circuit is arranged for supplying the power from the AC input to a load other than the light emitting element when the power from the AC input is not equal to or more than the lower cut-off value.

6. The light source of claim 1, wherein the driver circuit includes a capacitor for storing power from the AC input exceeding the upper cut-off value.

7. The light source of claim 1, wherein the driver circuit is arranged for supplying a portion of the power from the AC input to a load other than the light emitting element during a period in which the power from the AC input exceeds the upper cut-off value.

8. The light source of claim 1, wherein the light emitting element includes a plurality of light emitting members which are arranged for being supplied with power by the driver circuit independently, wherein the maximum operation power of the light emitting element is the maximum operation power of the plurality of light emitting members, wherein the driver circuit is arranged for supplying power to just a subset of the plurality of light emitting members during a period in which the power from the AC input is equal to or below an addition value.

9. The light source of claim 1, wherein the driver circuit includes a single-ended primary-inductor converter, a boost converter or a synchronous inverter arranged such that it is controllable whether an output of the converter or inverter and/or the power from the AC input is forwarded to the light emitting element.

10. The light source as defined in claim 1, wherein the light emitting element includes a laser emitting element, preferably a laser diode, wherein most preferably the light emitting element includes a VCSEL.

11. The light source as defined in claim 1, wherein the lower cut-off value and the upper cut-off value are set in such a way that the efficiency of the light emitting element at the lower cut-off value corresponds to the efficiency of the light emitting element at the upper cut-off value.

12. Use of a driver circuit for driving a light emitting element of a solid state light source, wherein the driver circuit is arranged for receiving an AC input and for supplying power with an AC period to the light emitting element, wherein the light emitting element has a maximum efficiency power and a maximum operation power, wherein the driver circuit is arranged for forwarding power from the AC input to the light emitting element while limiting the forwarded power to an upper cut-off value between the maximum efficiency power and maximum operation power, inclusive, such that the solid state light source during light emission can be directly supplied with the AC input directly forwarded by the driver circuit during a part of the AC period, wherein the light emitting element further has a minimum operation power, and wherein the driver circuit is arranged for storing power from the AC input exceeding the upper cut-off value and for supplying stored power to the light emitting element in addition to the forwarded power from the AC input during a period in which the power from the AC input is equal to or below a lower cut-off value.

13. A method for driving a light emitting element of a solid state light source, the light emitting element having a maximum efficiency power, a maximum operation power and a minimum operation power, the method including:

receiving an AC input and supplying power with an AC period to the light emitting element, and forwarding power from the AC input to the light emitting element while limiting the forwarded power to an upper cut-off value between the maximum efficiency power and maximum operation power, inclusive, such that the solid state light source during light emission can be directly supplied with the AC input directly forwarded by the driver circuit during a part of the AC period, storing power from the AC input exceeding the upper cut-off value, and supplying stored power to the light emitting element in addition to the forwarded power from the AC input during a period in which the power from the AC input is equal to or below a lower cut-off value.

* * * * *